(12) United States Patent
Shen

(10) Patent No.: US 6,791,114 B2
(45) Date of Patent: Sep. 14, 2004

(54) FUSED PASSIVE ORGANIC LIGHT EMITTING DISPLAYS

(75) Inventor: Zilan Shen, West Windsor, NJ (US)

(73) Assignee: Intel Corporation, Santa Clara, CA (US)

( * ) Notice: Subject to any disclaimer, the term of this patent is extended or adjusted under 35 U.S.C. 154(b) by 64 days.

(21) Appl. No.: 09/904,237

(22) Filed: Jul. 12, 2001

(65) Prior Publication Data

US 2003/0010985 A1 Jan. 16, 2003

(51) Int. Cl.[7] .................. H01L 27/15; H01L 31/12; H01L 33/00; H01L 21/00
(52) U.S. Cl. .................. 257/79; 257/40; 257/59; 257/72; 257/88; 257/528; 257/529; 257/642; 257/643; 257/759; 257/904
(58) Field of Search .................. 257/40, 79, 88, 257/59, 72, 642, 643, 759, 528, 529, 904; 438/131, 132, 467

(56) References Cited

U.S. PATENT DOCUMENTS

| | | | |
|---|---|---|---|
| 4,670,970 A | * | 6/1987 | Bajor .................. 438/467 |
| 5,530,269 A | * | 6/1996 | Tang .................. 257/88 |
| 5,859,772 A | * | 1/1999 | Hilpert .................. 363/56.03 |
| 6,013,538 A | * | 1/2000 | Burrows et al. .................. 438/22 |
| 6,191,433 B1 | * | 2/2001 | Roitman et al. .................. 257/40 |
| 6,476,563 B2 | * | 11/2002 | Silvestre .................. 315/169.3 |
| 2002/0005564 A1 | * | 1/2002 | Marr et al. .................. 257/529 |
| 2002/0036471 A1 | * | 3/2002 | Silvestre .................. 315/160 |
| 2002/0063533 A1 | * | 5/2002 | Swallow .................. 315/169.3 |
| 2002/0125504 A1 | * | 9/2002 | Perlov et al. .................. 257/207 |
| 2002/0126526 A1 | * | 9/2002 | Taussig et al. .................. 365/175 |
| 2002/0191464 A1 | * | 12/2002 | Chernobrod et al. .................. 365/215 |
| 2003/0011715 A1 | * | 1/2003 | Montague .................. 337/198 |

FOREIGN PATENT DOCUMENTS

JP                06188150 A    *    7/1994    ............ H01G/9/00

OTHER PUBLICATIONS

KR 2003026424 A, Jung et al., Organic Electroluminescent Device and Method for Manufacturing the Same, Sep. 25, 2001.*

* cited by examiner

Primary Examiner—Amir Zarabian
Assistant Examiner—Ida M. Soward
(74) Attorney, Agent, or Firm—Trop, Pruner & Hu, P.C.

(57) ABSTRACT

An organic light emitting device display may include transverse row and column lines. In a passively driven OLED display, a fuse may be positioned between the OLED material and the row electrode. When a short occurs, the single pixel may be separated from the circuit by the fuse, avoiding the possibility that an entire row of pixels may be adversely affected by the short associated with one single pixel along a row.

18 Claims, 2 Drawing Sheets

FUSED PASSIVE ORGANIC LIGHT EMITTING DISPLAYS

BACKGROUND

This invention relates generally to passive, organic light emitting device displays.

Organic light emitting device (OLED) displays offer the potential for bright, three-color displays for various applications. OLEDs emit light when current flows through the OLED material.

Two driving schemes are used to drive OLED displays. In an active driving scheme, transistors, such as thin film transistors, may be used to individually control the brightness of each pixel. In this scheme, a single pixel short results in a dark spot in a display that may be unnoticeable by human eyes. Due to the requirement of the OLED, crystalline silicon or high temperature polysilicon thin film transistors are usually used as controlling devices on the back plane of the display. These thin film transistors may add a relatively substantial cost to the display.

Work is ongoing to improve the performance of low temperature polysilicon and amorphous silicon based transistors. However, a cost-effective method for OLED displays is still not widely available.

Passively driven displays, on the other hand, provide a simple and cost-effective solution for small area OLED displays. With the development of tiling techniques, large area, cost-effective OLED displays become a possibility. With large area OLED displays, OLED pixels within each tile may be passively driven.

Since OLED devices are very thin (on the order of several hundred Angstroms), pixel shorts may occur. With local, passive matrix schemes, one shorted OLED pixel can take out an entire row and/or column that is associated with the short pixel.

Generally, in passive displays, a line is driven one at a time. In one example, an entire row may be activated at one time and then each of the columns selectively activated to light pixels along the row. Thus, if one pixel goes bad, the optical characteristics of the entire row may be adversely affected.

Referring to FIGS. 7 and 8, a pixel may be made up of a metal row 14 that extends transversely to a transparent conductive column 12. Between the row 14 and column 12 is the OLED 16. As shown in FIG. 8, the OLED is sandwiched between transverse rows 14 and columns 12. Light is emitted through the column 12 which is transparent. Once the OLED pixel is shorted, the row 14 and the column 12 that connect to the pixel are both shorted.

Thus, there is a need for a way to reduce the adverse consequences of pixel shorting in passive OLED displays.

DETAILED DESCRIPTION

Figure 1:
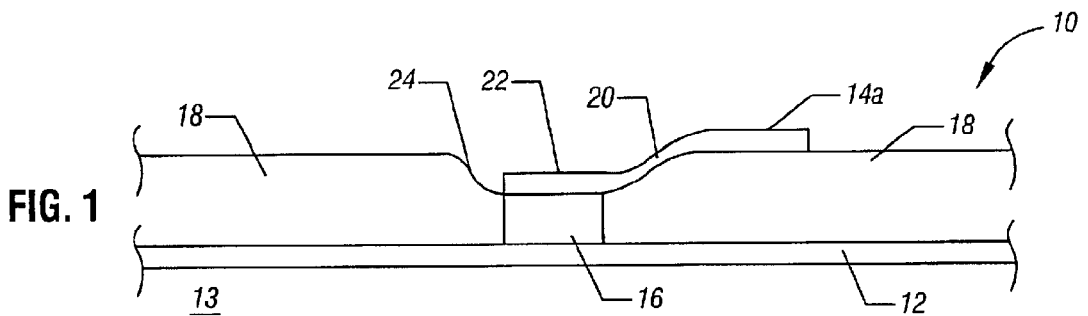
FIG. 1 is a greatly enlarged cross-sectional view in accordance with one embodiment of the present invention.

A pixel of an organic light emitting device (OLED) display 10 includes a transparent column electrode 12 and a transverse row electrode 14a as indicated in FIG. 1. In some cases, the column electrode 12 is made of indium tin oxide (ITO) so that light emitted by the OLED material 16 passes outwardly through the column 12. The row electrode 14a is coupled by a thin region or fuse 20 to a contact 22 on one surface of the OLED material 16. An insulator 18 may be provided to separate the row electrode 14a from the column electrode 12. A depression 24 may be formed in the insulation 18 to create an opening to contact the OLED material 16 in one embodiment.

Figure 2:
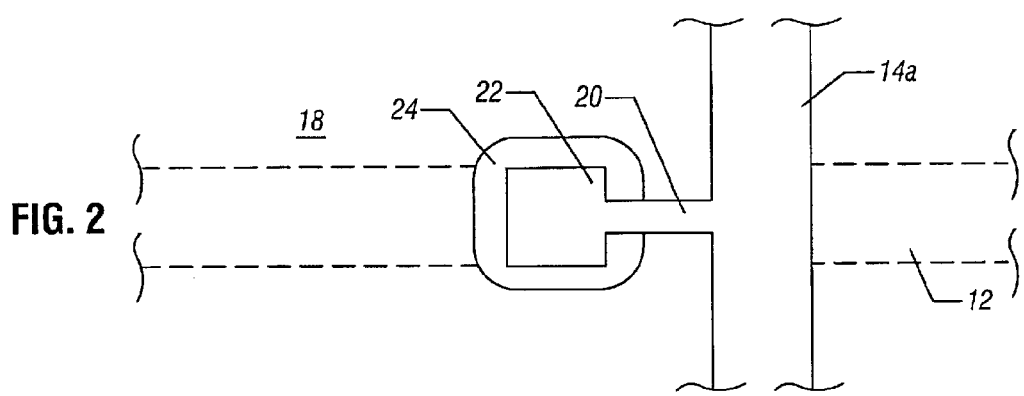
FIG. 2 is a top plan view of the embodiment shown in FIG. 1.

Referring to FIG. 2, the fuse 20 is an extension from the row electrode 14a that extends downwardly to an enlarged contact 22 in the opening 24. In some embodiments by offsetting the row electrode 14a upwardly with respect to the OLED material 16, the fuse 20 may be provided without substantially increasing the footprint or space required for each pixel of the display 10.

Conventionally, the row electrode 14a is made of a metal such as aluminum. The fuse 20 may utilize the electron migration behavior of thin film metal interconnection lines. For example, for an 80 nanometer thick aluminum line, the electron migration limit is about 10 milliamps per micron. If the current density in the thin metal fuse 20 is higher than the electron migration limit, local heating occurs, causing the fuse 20 to burn out. Therefore, the electron migration limit can be used to form a fuse such than when the current exceeds the electron migration limit, the fuse burns out, stopping the current flow.

In some embodiments, the insulator 18 prevents shorts between the row and column electrodes 14a and 12 while also defining the OLED pixel. The insulator 18 may be, for example, oxide or nitride material. The width of the fuse 20 may be designed so that it does not add too much resistance when the OLED pixel functions properly.

For example, for a 40 row display, a 100 micron by 100 micron OLED pixel may use about 10 volts and 10 milliamps peak current to produce constant brightness of about 100 candelas in one embodiment. The resistance of the fuse 20 may be as much as about 1 ohm without disturbing the circuit's function. Since the resistance of the row 14 is about 0.06 ohms per square centimeter, a 20 micron long, 10 micron wide fuse adds about 0.1 ohms to the circuit. When the OLED is shorted, the current on the fuse is about 10 volts per 0.3 ohms or 100 amps. The electron migration limit for a 10 micron line is about 100 milliamps which is much less than 100 amps.

Therefore, when an OLED pixel is shorted, the current passing through the fuse 20 is large enough to cause the electron migration limit to be exceeded, thereby burning open the fuse 20. As a result, the shorted OLED pixel is then disconnected from the driving circuit formed by the row and column lines. This shorted OLED pixel causes only one dark spot in the display 10. This single dark spot may be much less noticeable than adversely affecting an entire row.

Figure 3:
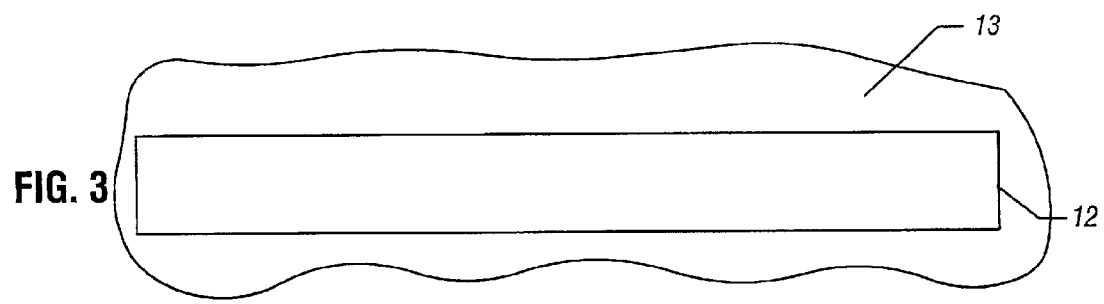
FIGS. 3 through 6 show a process of forming the devices shown in FIGS. 1 and 2 in accordance with one embodiment of the present invention.
Figure 4:
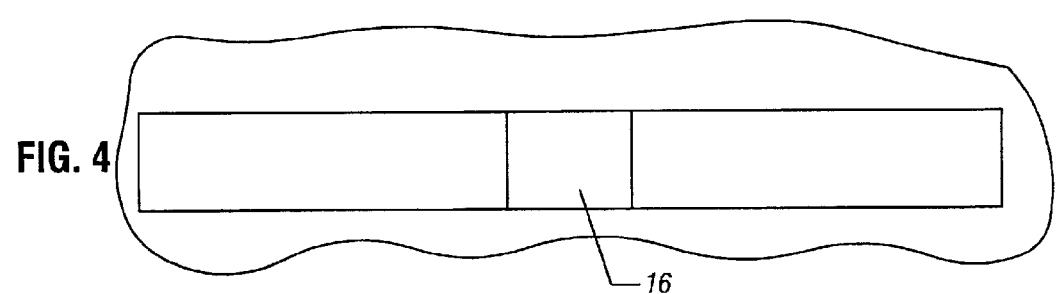
Figure 5:
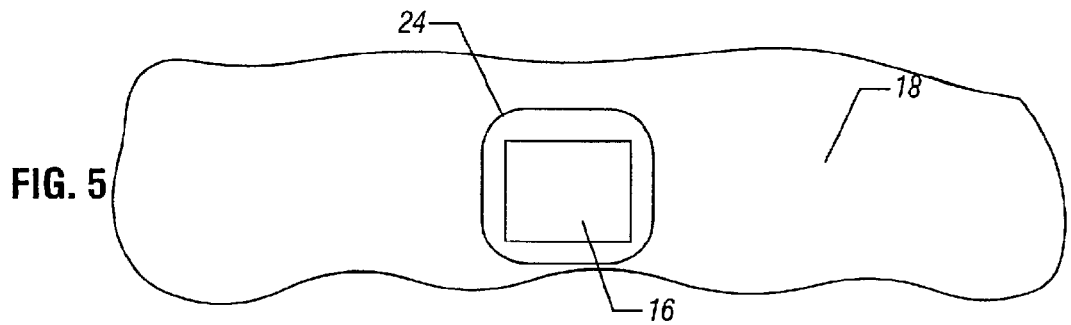
Figure 6:
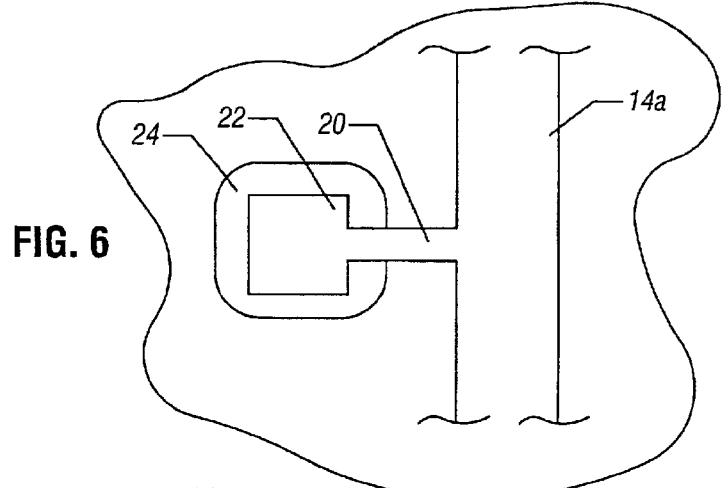
Figure 7:
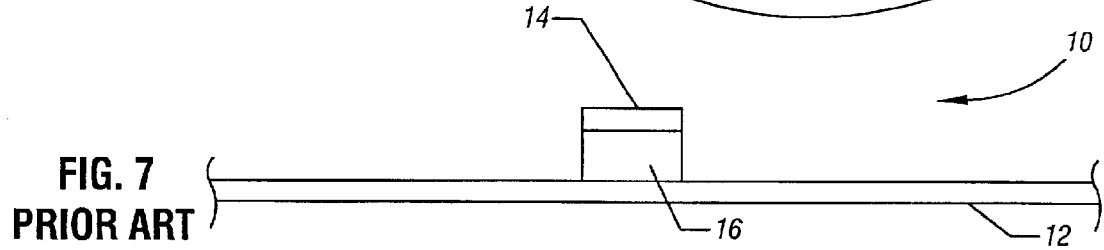
FIG. 7 is a greatly enlarged cross-sectional view in accordance with the prior art.
Figure 8:
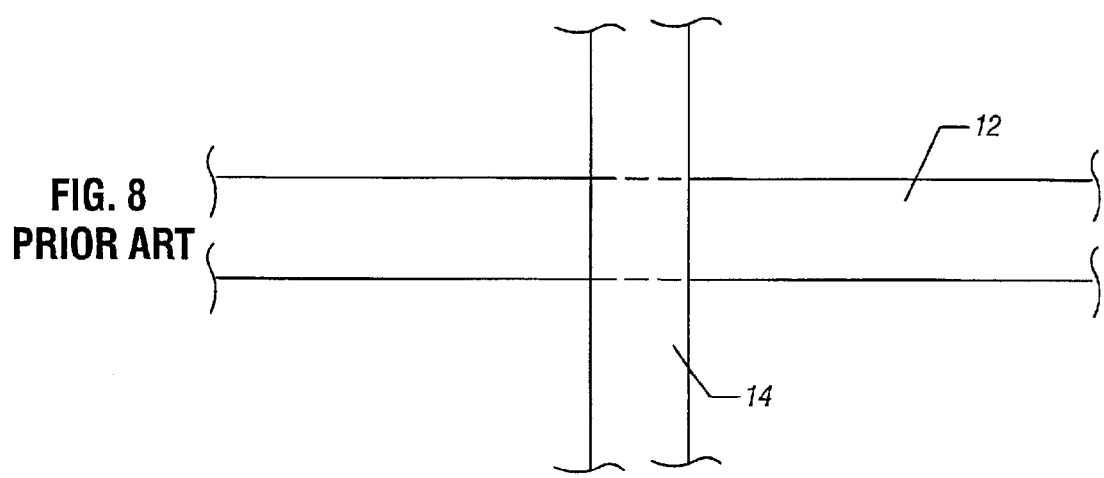
FIG. 8 is a top plan view of the embodiment shown in FIG. 7.

Referring to FIG. 3, initially, the columns 12 may be deposited and defined on a substrate 13. The columns 12 may be made of a transparent conductor, usually indium tin oxide (ITO). The substrate 13 may be made of glass or other transparent material. Next the OLED material 16 may be deposited and defined as shown in FIG. 4. The OLED material 16 may be surrounded by an insulator material 18, as shown in FIG. 5. Finally, the row electrode 14a may be deposited and defined to include the fuse 20 and contact 22, as shown in FIG. 6.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A display comprising:
   a first electrode formed of a metallic material;
   a second electrode formed of a transparent material;
   a light emitting material between said first and second electrodes; and
   a fuse between said first electrode and said light emitting material.

2. The display of claim 1 wherein said first electrode is a row electrode.

3. The display of claim 2 wherein said second electrode is a column electrode.

4. The display of claim 1 wherein said first and second electrodes are deposited on a transparent sheet.

5. The display of claim 1 wherein said light emitting material is an organic light emitting material.

6. The display of claim 1 wherein said fuse is formed integrally with said first electrode.

7. The display of claim 6 wherein said fuse is formed as a reduced width section of said first electrode.

8. The display of claim 7 wherein said fuse extends transversely from said first electrode.

9. The display of claim 8 wherein said fuse includes a contact that contacts said light emitting material, said fuse including a fusible element between said contact and said first electrode.

10. The display of claim 9 wherein said fuse is formed of a material that fails by electron migration when the current density through said fuse exceeds a limit.

11. A display comprising:
    a substantially transparent electrode;
    a substantially non-transparent electrode extending generally transversely to said transparent electrode;
    an organic light emitting material between said transparent and non-transparent electrodes; and
    a fuse between said non-transparent electrode and said organic light emitting material.

12. The display of claim 11 wherein said transparent electrode is a column electrode and said non-transparent electrode is a row electrode.

13. The display of claim 11 wherein said fuse is integral with said non-transparent electrode.

14. The display of claim 11 wherein said fuse is a reduced width section of said non-transparent electrode.

15. The display of claim 11 wherein said fuse extends generally transversely to said non-transparent electrode.

16. The display of claim 11 wherein said fuse is formed of a material that fails by electron migration when the current density through said fuse exceeds a limit.

17. The display of claim 16 wherein said fuse is formed of the same material as said non-transparent electrode.

18. The display of claim 11 wherein said fuse includes a contact that contacts said organic light emitting material, said fuse including a fusible element between said contact and said non-transparent electrode.

* * * * *